United States Patent [19]
Barret

[11] Patent Number: 6,054,740
[45] Date of Patent: Apr. 25, 2000

[54] PROTECTION AGAINST OVERVOLTAGES OF AN INTEGRATED MOS POWER TRANSISTOR

[75] Inventor: Jean Barret, Eguilles, France

[73] Assignee: STMicroelectronics S.A., Gentilly, France

[21] Appl. No.: 09/085,520

[22] Filed: May 27, 1998

[30] Foreign Application Priority Data

May 28, 1997 [FR] France ................................. 97 06823

[51] Int. Cl.⁷ .......................... H01L 27/01; H01L 27/12; H01L 31/0392
[52] U.S. Cl. ........................................... 257/355; 257/173
[58] Field of Search ..................................... 257/355, 173

[56] References Cited

U.S. PATENT DOCUMENTS

| | | | |
|---|---|---|---|
| 5,162,966 | 11/1992 | Fujihira | 257/140 |
| 5,521,414 | 5/1996 | Palara | 257/355 |
| 5,543,645 | 8/1996 | Barret et al. | 257/328 |
| 5,563,436 | 10/1996 | Barret et al. | 257/328 |
| 5,739,998 | 4/1998 | Wada . | |
| 5,818,088 | 10/1998 | Ellis . | |
| 5,828,089 | 10/1998 | Bernier . | |

*Primary Examiner*—Stephen D. Meier
*Attorney, Agent, or Firm*—Theodore E. Galanthay; Robert Iannucci; Seed IP Law Group

[57] ABSTRACT

The present invention relates to a protection device for a component including a vertical MOS power transistor and logic components. The protection device includes a first zener diode, a first terminal of which corresponds to the substrate and a second terminal of which corresponds to a region of the second type of conductivity formed in the substrate. It also includes a second zener diode of the same type of conductivity as the first zener diode but of higher avalanche voltage, the second terminals of both zener diodes being connected to a circuit for starting the power transistor via a logic circuit which only becomes conductive when one of its inputs is high and distinct from the other input.

13 Claims, 3 Drawing Sheets

PROTECTION AGAINST OVERVOLTAGES OF AN INTEGRATED MOS POWER TRANSISTOR

TECHNICAL FIELD

The present invention relates to components associating, in a same substrate, vertical diffused-type MOS power transistors (VDMOS) and logic circuits. More specifically, the invention relates to protection circuits for circuits having both VDMOS transistors and logic circuits.

BACKGROUND OF THE INVENTION

FIG. 1 schematically shows a portion of a component combining a VDMOS transistor and a logic circuit. This component includes an N-type substrate generally formed of an N-type epitaxied layer 1 formed on an N+-type substrate 2. A power transistor is formed in the right-hand portion and a logic well is formed in the left-hand portion.

The power transistor includes a set of identical cells connected to one another, such as cell 3. Each cell includes a P-type well 4, the central portion 5 of which is more heavily doped. An N-type ring 6 is formed in the upper portion of the well. The portion separating the external periphery of the N-type ring from the external periphery of the P-type well is coated with an insulated gate 8. The N-type ring 6, as well as central portion 5 of the well, are coated with a metallization 9. All gates 8 are connected to a gate terminal G and all metallizations 9 are connected to a source terminal S. The rear surface of the structure is coated with a drain metallization D. Thus, when a gate signal is applied, a current is likely to flow from terminal D to terminal S. More specifically, the current likely flows from N regions 1 and 2 to N region 6, via a channel formed under the insulated gates. This structure is generally used so that the drain is biased at a positive potential with respect to the source.

Although identical "cells" have been mentioned, the power transistor can have a digited structure. Regions 6 are then not "rings". This vocabulary will however be kept hereafter to simplify the discussion.

Logic circuits are formed in one or several wells 10. An elementary MOS transistor having drain, source, and gate terminals d, s and g has been shown in the well 10. This is only an example of a component likely to be formed in a logic well.

In some applications, a high positive overvoltage is likely to exist between the drain and the source while the MOS power transistor is blocked, or during a phase of switching to the off state. Such an overvoltage is likely to have the junction between substrate 1 and well 10 reverse breakdown and to cause the destruction of logic components formed in this well. To avoid this phenomenon, when such an overvoltage appears, it is known to momentarily restart the power transistor to have the overvoltage flow down through the power transistor. However, known solutions have several disadvantages which will be discussed hereafter.

FIG. 2 shows an example of a switched-mode power supply circuit in which an overvoltage is likely to occur on a power transistor. An input voltage $V_{in}$ is applied to a primary 20 of a transformer, a secondary 21 of which is connected to a capacitor 22 via a diode 23. An output voltage $V_{out}$ is available across capacitor 22. The second terminal of primary 20 is connected to the supply ground via an integrated component including a vertical MOS power transistor TP and a logic circuit 27. This logic circuit includes a terminal connected to the drain terminal of the power transistor, corresponding to the rear surface of the component of FIG. 1, a terminal connected to the ground and at least one input terminal 28 receiving control signals. This logic circuit 27 is especially meant for controlling the gate of the power transistor.

The operation of a switched-mode power supply is well known by those skilled in the art. It consists of periodically switching power transistor TP.

The operation upon switching of this power transistor will be described in relation with FIG. 3 which shows, as a function of time, drain voltage VD of the power transistor and current ID generally flowing through the component.

In an initial time period, between times t0 and t1, the power transistor is blocked and the voltage thereacross is equal to voltage $V_{in}$. Then, the power transistor has been turned on until a time t2, when the power transistor is desired to be turned back off. Normally, the voltage across this component increases until a value $V_{in}+(V_{out}+V_F)(np/ns)$, where $V_{in}$ designates the voltage at the transformer primary, $V_{out}$ the voltage at the transformer secondary, $V_F$ the forward voltage drop of diode 23, and np/ns the transformation ratio of the transformer. Then, at a time t3, once the transformer is demagnetized, the voltage drops to value $V_{in}$.

A problem which often arises is that the transformer has a certain parasitic inductance, associated to this transformer or to its connection wires, and that, immediately after time t2, a strong overvoltage occurs. Since the power transistor is then in an off phase, this overvoltage has a tendency to generate a current in the most fragile portion of the component, that is, through the junction between the substrate and the logic well. This overload can be destructive, as has been indicated previously.

To solve this problem, many solutions have been provided in prior art. Some of these provide the use of capacitors across the primary winding or across the power component to smoothen the overvoltage. These solutions have the disadvantage of requiring external components and of slowing down the switching, and thus of increasing energy losses in the component. Another solution is to arrange a zener diode in parallel with the power component to absorb the overload but, again, this requires the use of an external component. Eventually, this zener diode has been integrated in the monolithic structure including the power component and its logic circuit, but a zener diode of relatively large dimension must be used, and this is costly in terms of silicon surface.

The solution illustrated in FIG. 4 consists of using a zener diode Z having a protection threshold lower than the destruction threshold of power transistor TP and connected so that the zener's turning-on also turns on the power transistor. As an example, the control circuit of power transistor TP can include a current source 40 connected between the gate and the source of transistor TP, and a MOS transistor 41 in parallel to this source and likely to short-circuit the source when power transistor TP is desired to be turned off. A zener diode Z in series with a rectifying diode d is connected between the drain and the gate of the power transistor. The connection node between diodes Z and d is connected to the gate of transistor 41 via a logic circuit 42 used to turn off this transistor when the zener diode becomes conductive after an overvoltage. This control circuit will not be described in detail since it is only an example of a possibility of restart control by a zener diode Z detecting the drain voltage of a power transistor.

In practice, as shown in FIG. 5, zener diode Z is formed of a P-type region 50 formed in substrate 1. An anode metallization of this zener diode is connected to the gate of the power transistor via a diode d. Of course, this diode d will in practice be preferably integrated among the components of the logic circuit contained in well 10.

This embodiment however has a drawback illustrated in relation with FIG. 6 which shows voltage VD on the drain of MOS power transistor TP. As previously, it is assumed that transistor TP is off between times t0 and t1, and then that it is desired to turn it back off at a time t2. Then, the voltage on the drain increases until voltage $V_Z$, then the power component is turned back on to limit the voltage thereacross to this value $V_Z$. The phases previously described in relation with FIG. 3 are then repeated. The fast variation of the voltage across transistor TP creates a capacitive current within zener diode Z. This current tends to recharge the gate of transistor TP and thus reduces the blocking rate.

The disadvantage is that the slope of voltage VD during the blocking phase is much lower than previously, that is, the blocking duration is much longer and the losses thus increase. This is of course a disadvantage when it is desired to implement a switched-mode power supply with as fast a response time as possible. This increase of the slope is due to the existence of a stray capacitance C across zener diode Z, this stray capacitance being shown in dotted lines in FIG. 4.

SUMMARY OF THE INVENTION

An embodiment of the present invention ensures protection of a component including a vertical MOS power transistor and a logic circuit, against overvoltages on the drain, while maintaining the switching speed of the power transistor.

To achieve this, the present invention provides a protection device for a component including a vertical MOS power transistor and logic components. The substrate has a first type of conductivity and corresponds to the drain of the MOS transistor, and the logic components are formed in at least one well of the second type of conductivity and on the upper surface side of the substrate. The protection circuit includes a first zener diode, a first terminal of which corresponds to the substrate and a second terminal of which corresponds to a region of the second type of conductivity formed in the substrate. It also includes a second zener diode of the same type of conductivity as the first zener diode but of higher avalanche voltage, the second terminals of both zener diodes being connected to a circuit for starting the power transistor via a logic circuit which only becomes conductive when one of its inputs is high and distinct from the other input.

According to another embodiment of the present invention, the avalanche voltage of the second zener diode is substantially equal to the breakdown voltage of the component.

The foregoing features and advantages of the present invention will be discussed in detail in the following non-limiting description of specific embodiments in connection with the accompanying drawings.

DETAILED DESCRIPTION OF THE INVENTION

In the various drawings, same elements are referred to with same references. Further, in the various cross-sectional views of semiconductor components, as is usual, the various dimensions are not drawn to scale but are arbitrarily expanded to facilitate the readability of the drawings.

Figure 6:
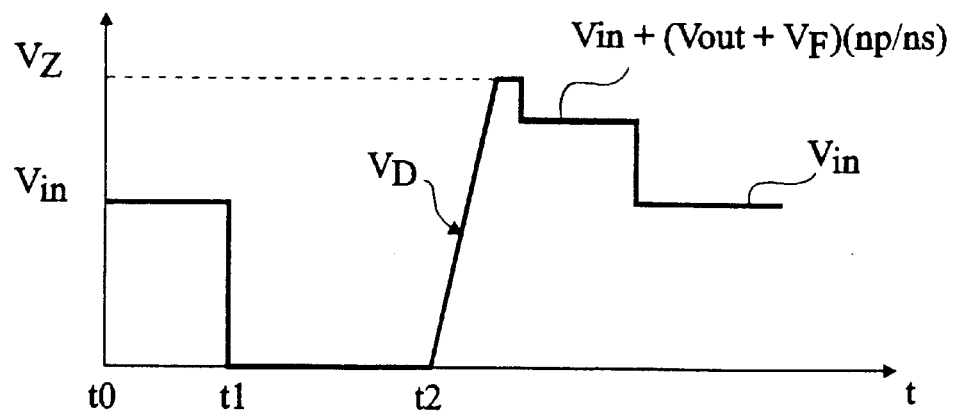
FIG. 6 shows voltage and current curves corresponding of the circuit shown in FIGS. 4 and 5.
Figure 4:
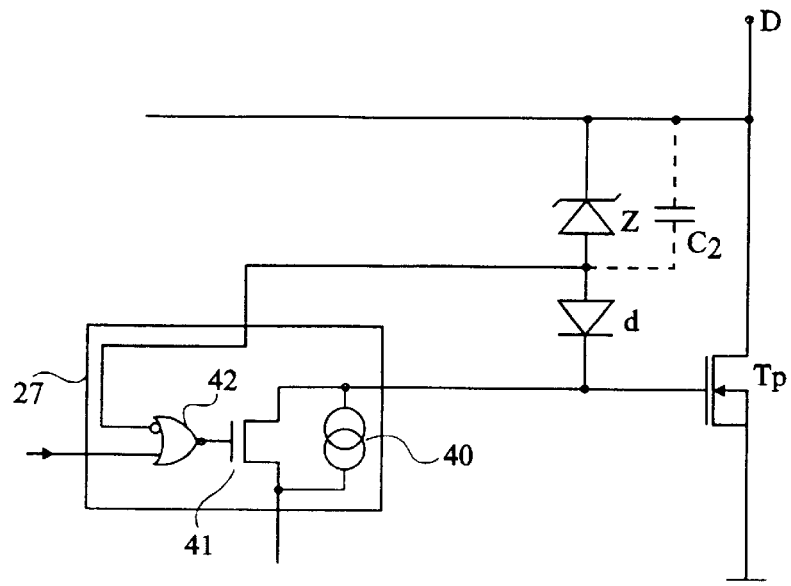
FIG. 4 shows a circuit diagram showing an alternative configuration of a portion of the circuit of FIG. 2.
Figure 5:
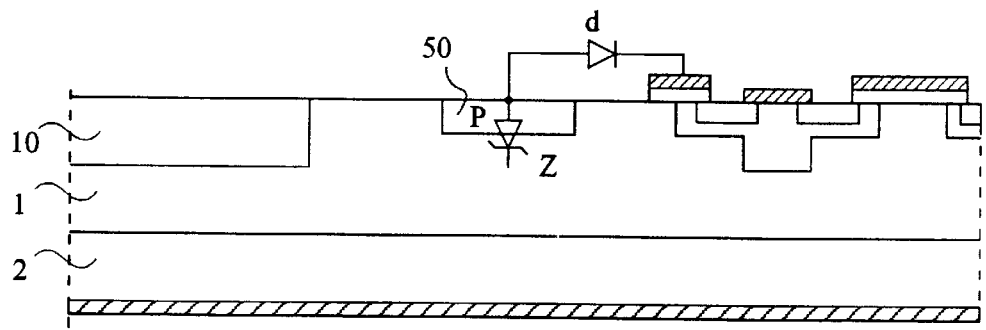
FIG. 5 shows a side view of the substrate for the alternative of the component of FIG. 1 including the alternative circuit of FIG. 4, according to prior art.
Figure 7:
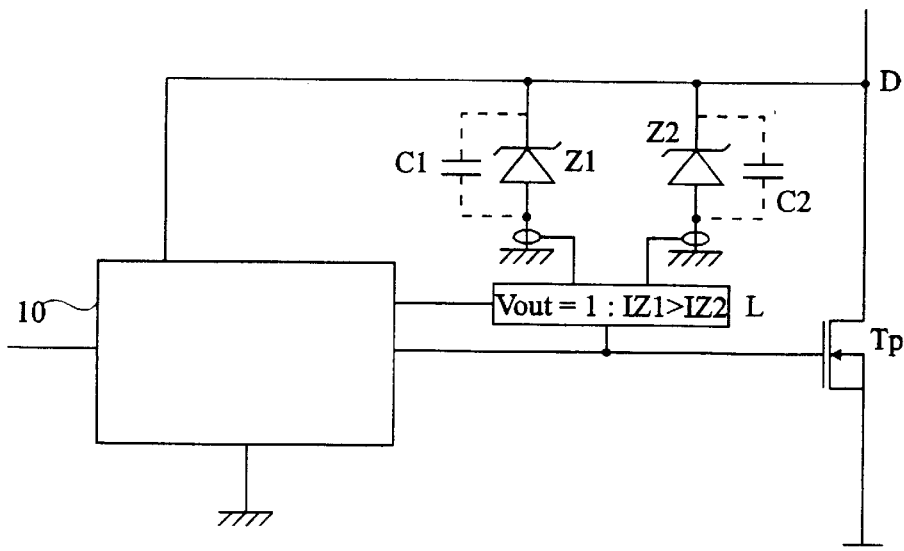
FIG. 7 shows a schematic diagram of the protection circuit according to the present invention.

The present invention aims, like the structures of prior art described in relation with FIGS. 4 to 6, at restarting the power transistor of a component including a vertical MOS power transistor and a logic circuit when this component is submitted to a high overvoltage. Thus, as previously, it is provided to detect a protection voltage slightly lower than the breakdown voltage of the component and to restart power transistor TP as soon as this protection voltage is reached.

The present invention realizes the detection by connecting two zener diodes Z1 and Z2 to drain D of power transistor TP and more specifically, in the previously-described case where the drain is of type N, it is the cathodes of zener diodes that are connected to the drain. The anodes of zener diodes Z1 and Z2 are connected via a logic circuit L, issuing a signal likely to enable a restarting of the power transistor when the voltage exceeds the threshold of one of the zener diodes. More specifically, one of the zener diodes, for example zener diode Z1, is chosen so that its avalanche voltage is equal to the desired protection voltage. The second zener diode, Z2, will have a higher avalanche voltage, for example, the same avalanche voltage as the well of the logic components.

Logic circuit L ensures the following functions: it issues no output signal when its two inputs are equal and issues an output signal as soon as one of its inputs is as high and higher than its other input. This logic circuit compares the currents which flow through zener diodes Z1 and Z2. When the current of diode Z1 is higher than that of diode Z2, circuit L issues a signal to restart power transistor TP. In fact, logic circuit L will be preferably incorporated in logic well 10 and has been shown outside this well only for the simplicity of description of the drawing.

Figure 1:
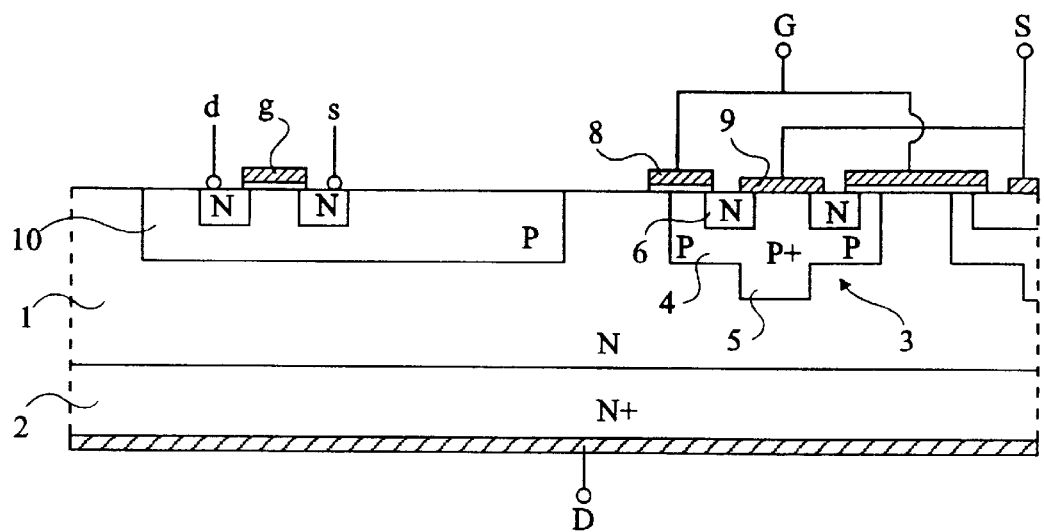
FIG. 1 shows a side view of the substrate of a component to which the present invention applies.
Figure 2:
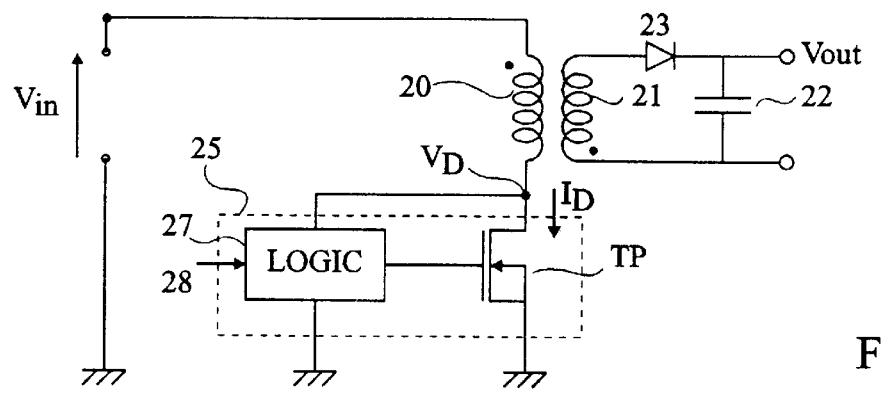
FIG. 2 shows a circuit diagram of the component of FIG. 1.
Figure 3:
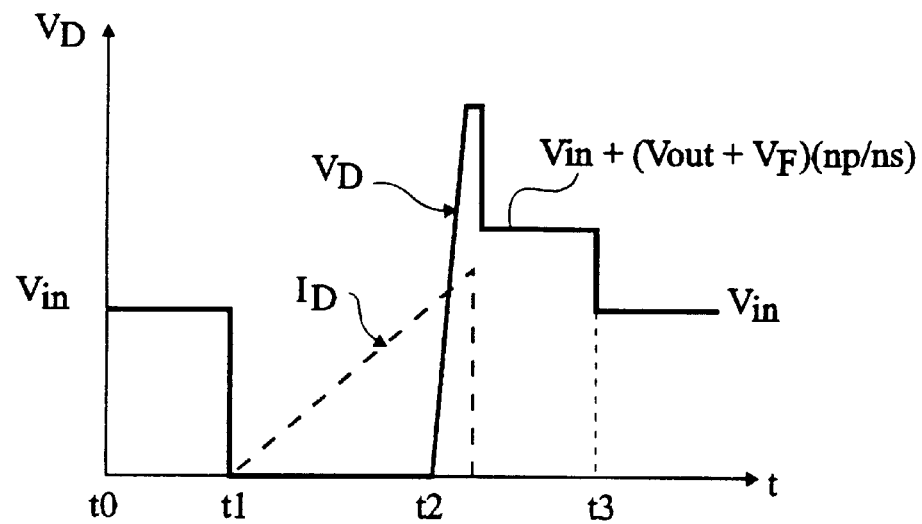
FIG. 3 shows voltage and current curves of the circuit of FIG. 2.

Each of zener diodes Z1 and Z2 can for example be implemented like diode Z illustrated in FIG. 5, that is, formed of a P region formed in the epitaxial layer 1. These zener diodes will have a same surface to exhibit identical stray capacitances C1 and C2 and distinct avalanche voltages, which can be obtained, for example, by providing that the P region of one of the zener diodes is more doped or deeper than the other. Thus, at the beginning of the switching phase of the component, after time t2 of FIG. 3 or 6, the anode voltages of the two zener diodes increase simultaneously under the effect of their stray capacitance, but these voltages are not reflected in the control circuit since logic circuit L issues no output when its two inputs are equal. The rising time of the voltage across the component will thus be the same as that of FIG. 3, and will not be slowed down like in the case of FIG. 6. Only when the zener diode of smaller avalanche threshold (corresponding to the protection threshold) enters conduction does the device start its action in a similar way as what has been described in relation with FIG. 6. The advantages of the integrated protection described in relation with FIGS. 4, 5, and 6 are thus obtained without the drawback of the slowing down of the time of switching to the off state.

Of course, various alterations, modifications, and improvements of logic circuit L, and of the connection mode of this circuit to the gate of the power transistor, may be moved by those skilled in the art.

As concerns the implementation of zener diodes Z1 and Z2, zener diodes formed from elements similar to the wells of the MOS power transistor may advantageously be used, as is described in U.S. Pat. No. 5,543,645 hereby incorporated by reference. The preference is that the two zener diodes have distinct threshold voltages and substantially equal stray capacitances.

The invention is to be broadly interpreted and alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A protection device for a circuit including a vertical MOS power transistor and logic components, comprising:
    a substrate of a first type of conductivity of the component corresponding to the drain of the MOS transistor and the logic components being formed in at least one well of a second type of conductivity and on an upper surface side of the substrate, including a zener diode, a first terminal of which corresponds to the substrate and a second terminal of which corresponds to a region of the second type of conductivity formed in the substrate; and
    a second zener diode of the same type of conductivity as the first zener diode but of a higher avalanche voltage, the second zener diode also having first and second terminals, the second terminals of both zener diodes being connected to a circuit for starting the power transistor via a logic circuit which only becomes conductive when one of its inputs is high and distinct from the other input.

2. The device of claim 1 wherein the avalanche voltage of the second zener diode is substantially equal to the breakdown voltage of one of the components.

3. In an integrated circuit containing a power transistor and containing other components, a protection circuit comprising:

a substrate having a first doping type and first and second surfaces, the second surface of the substrate coupled to the power transistor;
    a well of a second doping type formed in the substrate at the first surface thereof;
    a first and a second zener diode formed in the substrate and both zener diodes coupled to the power transistor; and
    a logic circuit coupled to the zener diodes and coupled to the power transistor, the logic circuit adapted to turn on the power transistor when the currents flowing through the first and second zener diodes are unequal.

4. The protection circuit of claim 3 wherein an avalanche breakdown voltage of one of the zener diodes is nearly equal to a breakdown voltage of the other components in the integrated circuit.

5. The protection circuit of claim 3 wherein the zener diodes are formed within the well.

6. The protection circuit of claim 3 wherein the power transistor is an MOS transistor, the second surface of the substrate is coupled to a drain of the power transistor, and the zener diodes are also coupled to the drain of the power transistor.

7. The protection circuit of claim 3 wherein the first and second zener diodes have different avalanche voltages.

8. The protection circuit of claim 7 wherein one of the zener diodes has a higher doping level than the other.

9. The protection circuit of claim 7 wherein one of the zener diodes is formed deeper in the substrate and farther from the first surface than the other.

10. In an integrated circuit, a method of circuit protection for a circuit containing a power MOS transistor and other components including the steps of:
    sensing a drain voltage of the power MOS transistor;
    comparing the drain voltage of the power MOS transistor by using a first and a second zener diode coupled to a logic circuit;
    not enabling the power transistor by the logic circuit when the first and second zener diodes are in a same mode of operation; and
    enabling the power transistor by the logic circuit when the zener diodes are operating in different modes.

11. The method of claim 10 wherein the step of comparing the drain voltage comprises sensing current flowing through the first and second zener diodes.

12. The method of claim 10 wherein the avalanche breakdown voltage of the two zener diodes is dissimilar.

13. The method of claim 12 wherein the avalanche breakdown voltage of one of the two zener diodes is below a breakdown voltage of any other component in the integrated circuit.

* * * * *